(12) United States Patent
Wu et al.

(10) Patent No.: US 12,532,502 B2
(45) Date of Patent: Jan. 20, 2026

(54) HIGH VOLTAGE SEMICONDUCTOR DEVICES AND METHODS OF MANUFACTURING THEREOF

(71) Applicant: Taiwan Semiconductor Manufacturing Company, Ltd., Hsinchu (TW)

(72) Inventors: Hong-Shyang Wu, Taipei (TW); Kuo-Ming Wu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 610 days.

(21) Appl. No.: 17/882,390

(22) Filed: Aug. 5, 2022

(65) Prior Publication Data
US 2024/0047574 A1 Feb. 8, 2024

(51) Int. Cl.
*H10D 30/65* (2025.01)
*H10D 30/01* (2025.01)
(Continued)

(52) U.S. Cl.
CPC ......... *H10D 30/65* (2025.01); *H10D 30/0281* (2025.01); *H10D 62/116* (2025.01); *H10D 62/393* (2025.01); *H10D 64/112* (2025.01)

(58) Field of Classification Search
CPC .. H10D 30/65; H10D 30/0281; H10D 62/116; H10D 62/393; H10D 64/112;
(Continued)

(56) References Cited

U.S. PATENT DOCUMENTS 11,374,096 B1  6/2022  Lao et al.
2020/0176600 A1  6/2020  Lin et al.
(Continued)

FOREIGN PATENT DOCUMENTS

CN  111755417 A  * 10/2020  ....... H01L 21/76877
TW  I520336 B  2/2016

OTHER PUBLICATIONS

Office Action issued in connection with Taiwan Appl. No. 112105667 dated Aug. 29, 2024.

*Primary Examiner* — Shahed Ahmed
(74) *Attorney, Agent, or Firm* — FOLEY & LARDNER LLP

(57) ABSTRACT

A semiconductor device includes a first well of a first conductivity type near a surface of a semiconductor substrate, and a second well of a second conductivity type near the surface of the semiconductor substrate. The semiconductor device includes a transistor comprising: (i) a first source/drain region formed in the first well; (ii) a second source/drain region formed in the second well; and (iii) a gate structure formed near the surface of the semiconductor substrate and separated from the second source/drain region at least with a portion of a third well of the second conductive type. The semiconductor device includes an isolation structure formed near the surface of the semiconductor substrate and further separating the second source/drain region from the gate structure. The semiconductor device includes a plurality of field plates formed above at least one of the portion of the third well or the isolation structure.

20 Claims, 18 Drawing Sheets

(51) Int. Cl.
*H10D 62/10* (2025.01)
*H10D 62/17* (2025.01)
*H10D 64/00* (2025.01)

(58) Field of Classification Search
CPC .. H10D 30/026; H10D 30/657; H10D 84/151; H10D 84/835; H01L 21/76224–76237
See application file for complete search history.

(56) References Cited

U.S. PATENT DOCUMENTS

2021/0367073 A1* 11/2021 Snyder ................. H10D 30/657
2023/0317846 A1* 10/2023 Naquin ................. H01L 29/665
257/288

\* cited by examiner

HIGH VOLTAGE SEMICONDUCTOR DEVICES AND METHODS OF MANUFACTURING THEREOF

BACKGROUND

The semiconductor industry has experienced rapid growth due to improvements in the integration density of a variety of electronic components (e.g., transistors, diodes, resistors, capacitors, etc.). For the most part, this improvement in integration density has come from shrinking the semiconductor process node (e.g., shrink the process node towards the sub-10 nanometer or angstrom node). As semiconductor devices are scaled down, new techniques are needed to maintain the electronic components' performance from one generation to the next. For example, low gate-to-drain capacitance and high breakdown voltage of transistors are desirable for high power applications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
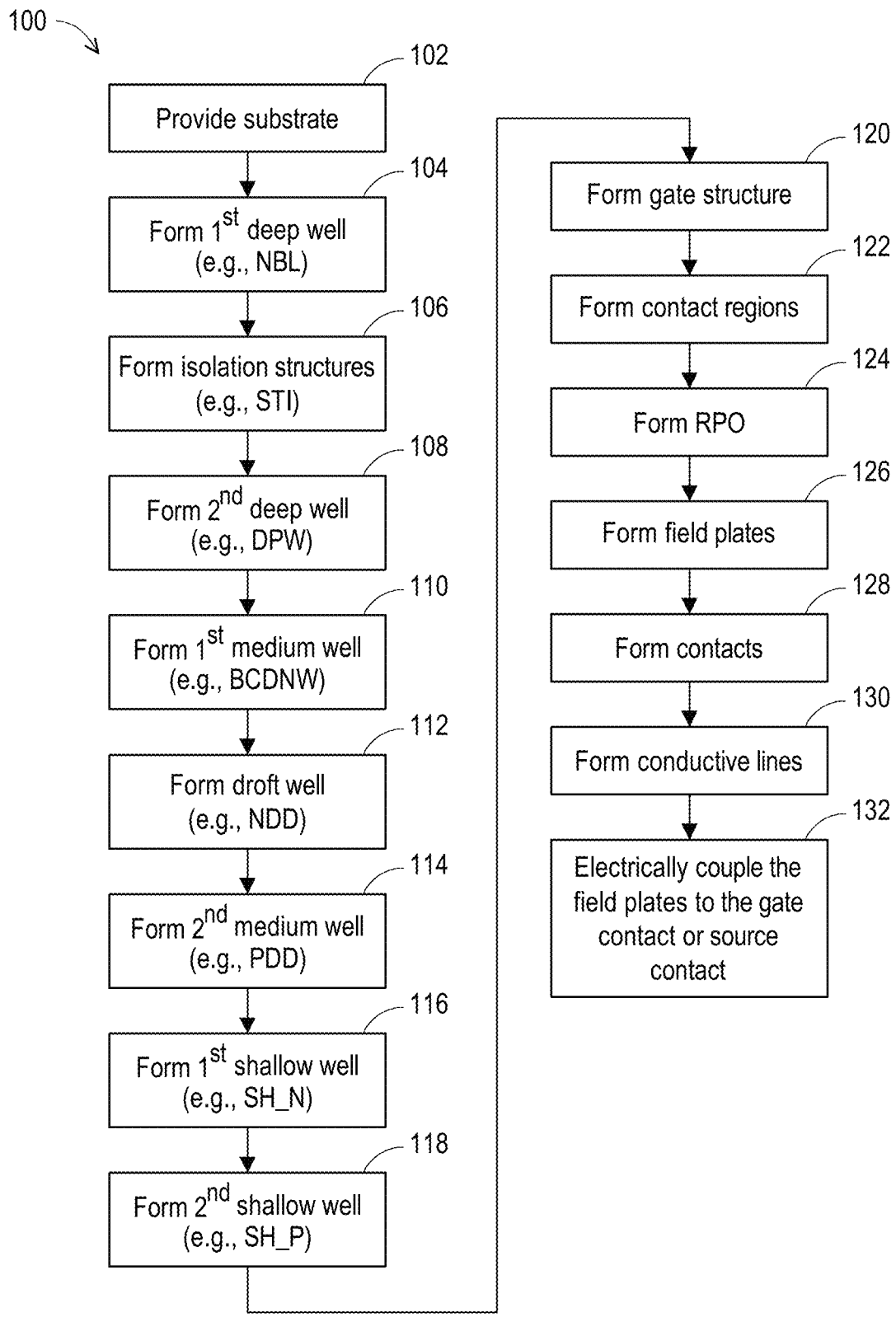
FIG. 1 is an example flow chart of a method for fabricating a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As semiconductor technologies evolve, metal oxide semiconductor field effect transistors (MOSFET) have been widely used in today's integrated circuits. MOSFETs are voltage controlled device. When a control voltage is applied to the gate a MOSFET and the control voltage is greater than the threshold of the MOSFET, a conductive channel is built between the drain and the source of the MOSFET. As a result, a current flows between the drain and the source of the MOSFET. On the other hand, when the control voltage is less than the threshold of the MOSFET, the MOSFET is turned off accordingly.

MOSFETs may include two major categories. One is n-channel MOSFETs; and the other is p-channel MOSFETs. According to the structure difference, MOSFETs can be further divided into three sub-categories, planar MOSFETs, laterally diffused MOS (LDMOS) FETs and vertically diffused MOSFETs. In comparison with other MOSFETs, the LDMOS is capable of delivering more current per unit area because its asymmetric structure provides a short channel between the drain and the source of the LDMOS. Such an LDMOS can typically operate under a relatively high voltage, which makes it become an attractive power device for use in radio frequency (RF) power applications (e.g., cellular infrastructure power amplifier applications).

The present disclosure provides various embodiments of methods to fabricate semiconductor devices in the context of forming a power device. For example, the methods as disclosed herein can be used to fabricate a laterally diffused metal-oxide-semiconductor (LDMOS) transistor. In some embodiments, the disclosed semiconductor device includes an isolation structure (e.g., a shallow trench isolation (STI) structure) separating a first portion of a drift region overlaid (e.g., operatively gated) by a gate structure from a drain region. With the STI structure, surface electric field within the drift region can be resurfaced or otherwise rerouted to extend along a bottom surface of the STI structure. Further, the drift region includes a second portion laterally interposed between the first portion and the STI structure, which can equivalently reduce a width of the STI structure. Further, the spared second portion of drift region allows a number of conductive field plates to be former thereon. As such, a breakdown voltage of the disclosed semiconductor device can still be configured over 20 volts (V), while keeping its conduction/channel resistance (sometimes referred to as "Ron") substantially low. This is because the shorted STI structure can reduce the equivalent length of a conduction path along the drift region while the field plates can keep the originally high breakdown voltage sustained. Further, with the conductive plates electrically coupled to the semiconductor device's gate terminal or source terminal, a capacitance coupled between the gate structure and the drain region (sometimes referred to as "Cgd") may be advantageously lowered, which enables the disclosed semiconductor device to operate under a relatively high frequency. Thus, the semiconductor device, as disclosed herein, may be suitable for being operated under a high breakdown voltage (e.g., over about 20V), while being operated in a high-frequency range (e.g., in the range of megahertz).

FIG. 1 illustrates a flowchart of an example method 100 for forming at least a portion of a semiconductor device 200, in accordance with some embodiments. It should be noted that the method 100 is merely an example, and is not intended to limit the present disclosure. Accordingly, it is understood that the order of operation of the method 100 of FIG. 1 can change, that additional operations may be provided before, during, and after the method 100 of FIG. 1, and that some other operations may only be described briefly herein. In some embodiments, operations of the method 100 may be associated with cross-sectional views of the example semiconductor device 200 at various fabrication stages as shown in FIGS. 2, 3, 4, 6, 7, 8, 9, 10, 11, 12, 13, 14, 15, 16, 17, and 18, respectively.

Further, the semiconductor device 200 shown in FIGS. 2-18 can include one or more transistors formed in a first area of a substrate that operate with a relatively high breakdown voltage (e.g., higher than about 20V). These transistors are sometimes referred to as high-voltage transistors (e.g., LDMOS transistors). It should be appreciated that at least some of the operations of the method 100 of FIG. 1 can be shared (e.g., concurrently performed) to form one or more transistors in a second area of the same substrate that operate with a relatively low breakdown voltage. These transistors are sometimes referred to as low-voltage or middle-voltage transistors (e.g., logic transistors). Each of the high-voltage, middle-voltage, and low-voltage transistors has a conduction type such as, for example an n-type transistor or a p-type transistor. The term "n-type," as used herein, may be referred to as the conduction type of a transistor having electrons as its conduction carriers; and the term "p-type," as used herein, may be referred to as the conduction type of a transistor having holes as its conduction carriers.

In a brief overview, the method 100 starts with operation 102 of providing a substrate. The method 100 proceeds to operation 104 of forming a first deep well. The method 100 proceeds to operation 106 of forming a number of isolation structures. The method 100 proceeds to operation 108 of forming a second deep well. The method 100 proceeds to operation 110 of forming a first medium well. The method 100 proceeds to operation 112 of forming a well configured as a drift region. Such a well may sometimes be referred to as a drift well. The method 100 proceeds to operation 114 of forming a second medium well. The method 100 proceeds to operation 116 of forming a first shallow well. The method 100 proceeds to operation 118 of forming a second shallow well. The method 100 proceeds to operation 120 of forming a gate structure. The method 100 proceeds to operation 122 of forming contact regions. The method 100 proceeds to operation 124 of forming a resist protective oxide layer. The method 100 proceeds to operation 126 of forming a number of field plates. The method 100 proceeds to operation 128 of forming contacts. The method 100 proceeds to operation 130 of forming conductive lines. The method 100 proceeds to operation 132 of electrically coupling the field plates to the gate structure or a source contact.

Figure 2:
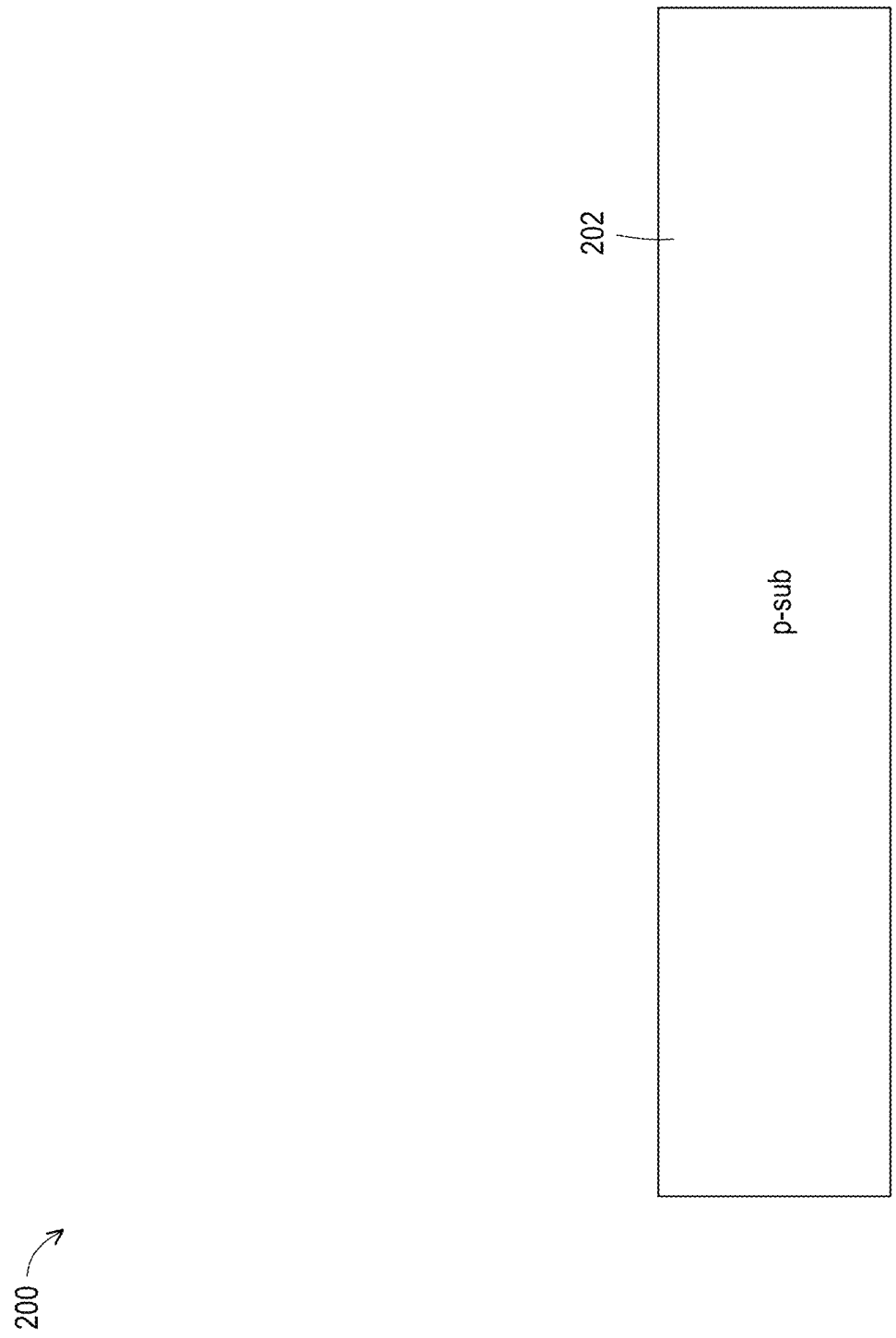
FIGS. 2, 3, 4, 5, 6, 7, 8, 9, 10, 11, 12, 13, 14, 15, 16, 17, and 18 illustrate cross-sectional views of an example semiconductor device during various fabrication stages, made by the method of FIG. 1, in accordance with some embodiments.

Corresponding to operation 102 of FIG. 1, FIG. 2 is a cross-sectional view of the semiconductor device 200 including a substrate 202, in accordance with various embodiments. As mention above, the substrate 202 may have a first area and a second area, where one or more high-voltage transistors and low/middle-voltage transistors are formed, respectively. The cross-sectional views of FIG. 2 (and the following figures) are directed to the first area of the substrate 202.

The substrate 202 may include a semiconductor wafer such as a silicon wafer. Alternatively, the substrate 202 may include other elementary semiconductors such as germanium. The substrate 202 may also include a compound semiconductor such as silicon carbide, gallium arsenic, indium arsenide, and indium phosphide. The substrate 202 may include an alloy semiconductor such as silicon germanium, silicon germanium carbide, gallium arsenic phosphide, and gallium indium phosphide. In one embodiment, the substrate 202 includes an epitaxial layer (epi layer) overlying a bulk semiconductor. Furthermore, the substrate 202 may include a semiconductor-on-insulator (SOI) structure. For example, the substrate 202 may include a buried oxide (BOX) layer formed by a process such as separation by implanted oxygen (SIMOX). In the following examples where an n-type high-voltage transistor (e.g., 200) is formed, the substrate 202 includes a p-type silicon substrate 202 with a dopant concentration of about $10^{10}$ to about $10^{11}$ $\mu m^{-2}$ (hereinafter "p-substrate 202").

Figure 3:
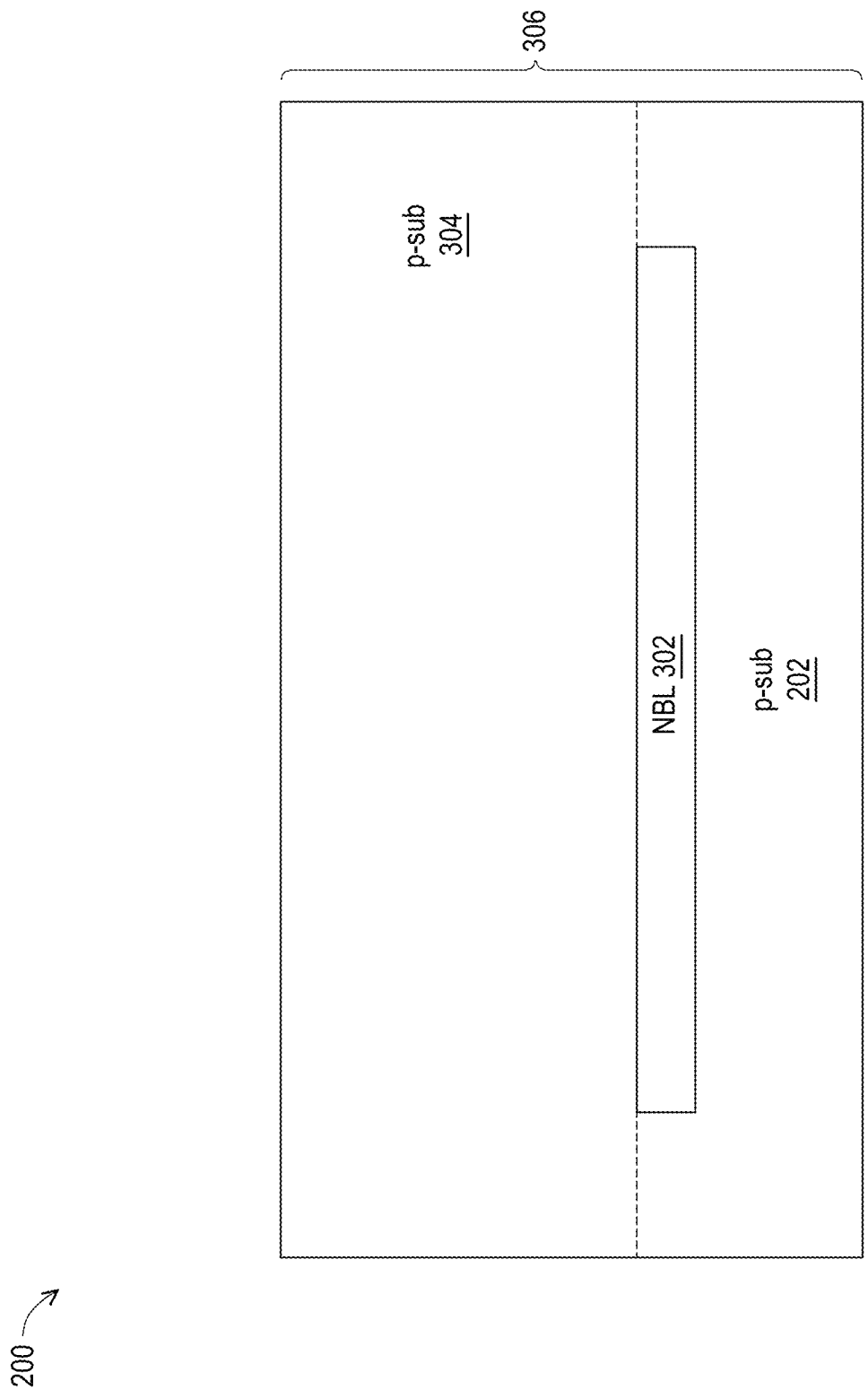

Corresponding to operation 104 of FIG. 1, FIG. 3 is a cross-sectional view of the semiconductor device 200 including a first deep well 302, in accordance with various embodiments. The first deep well 302 is buried in the p-substrate 202 and doped in n-type (hereinafter "n-buried layer (NBL) 302").

In various embodiments, the NBL 302 is first formed along a top surface of the p-substrate 202 (as indicated by dotted line in FIG. 3). The NBL 302 may be formed by implanting dopants into the top surface of the p-substrate 202, for example. The dopant may comprise antimony and/or phosphorus, which may be implanted into the p-substrate 202 at a dopant concentration of about $10^{13}$ to about $10^{14}$ $\mu m^{-2}$. Next, another p-substrate 304 is epitaxially grown over the p-substrate 202 and the NBL 302. In various embodiments, the overlaying p-substrate 304 may merge with the underlying p-substrate 202, which thus "bury" the NBL 302, as shown. Hereinafter, such merged p-substrates are collectively referred to as "p-substrate 306."

Figure 4:
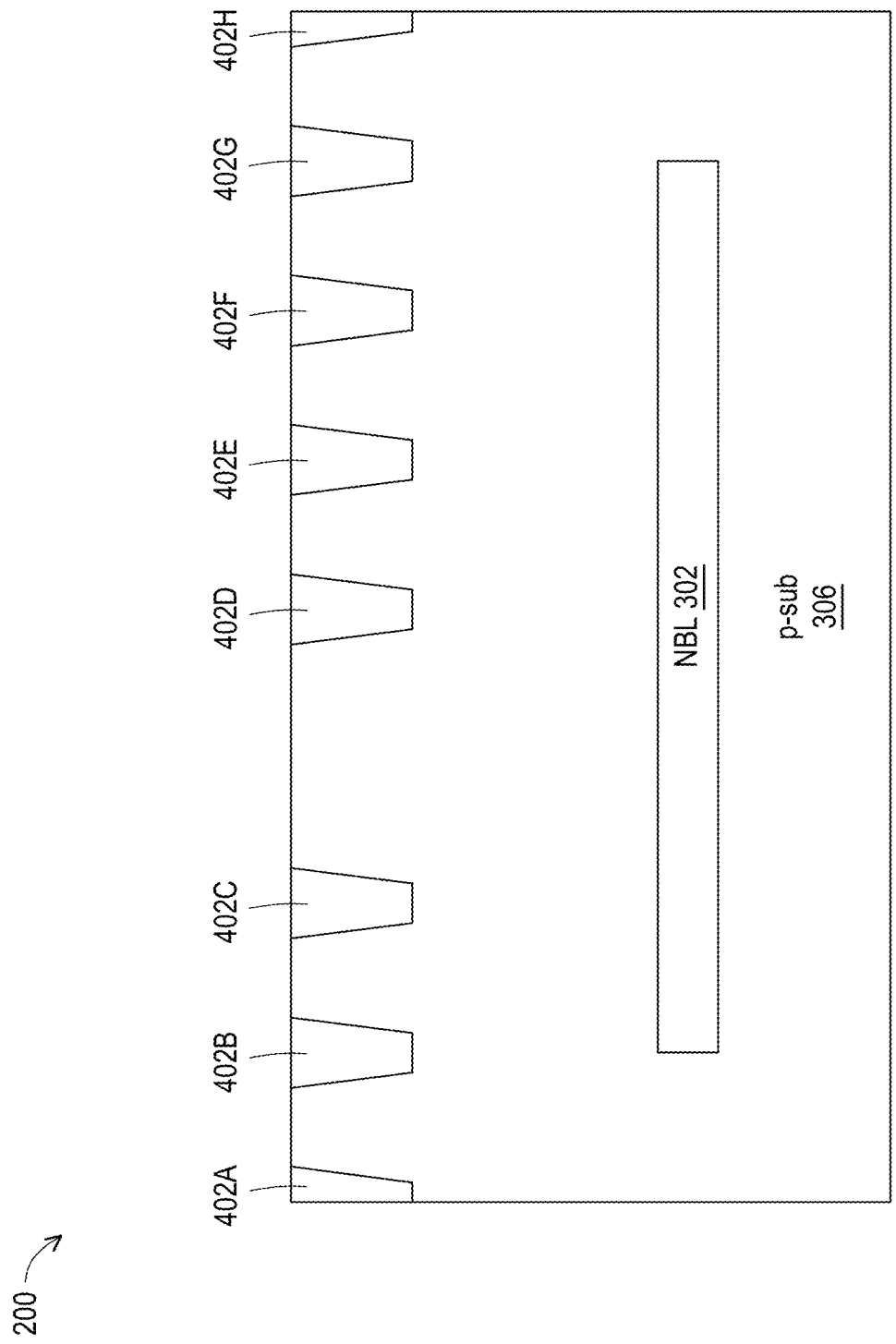

Corresponding to operation 106 of FIG. 1, FIG. 4 is a cross-sectional view of the semiconductor device 200 including a number of isolation structures 402A, 402B, 402C, 402D, 402E, 402F, 402G, and 402H, in accordance with various embodiments. The isolation structures 402A to 402H may be formed as shallow trench isolation (STI) structures. Such STI structures 402A to 402H may sometimes be collectively referred to as "STI structures 402."

The formation of STI structures 402 may include dry etching a number of trenches near a top surface of the p-substrate 306 and filling the trenches with insulator materials such as silicon oxide, silicon nitride, silicon oxynitride, hafnium oxide, undoped silicate glass, or combinations thereof. The filled trenches may have a multi-layer structure such as a thermal oxide liner layer filled with silicon nitride or silicon oxide. In furtherance of such an embodiment, the STI structure 402 may be created using a processing sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical polishing (CMP) processing to etch back and planarize, and using a nitride stripping process to remove the silicon nitride.

Figure 5:
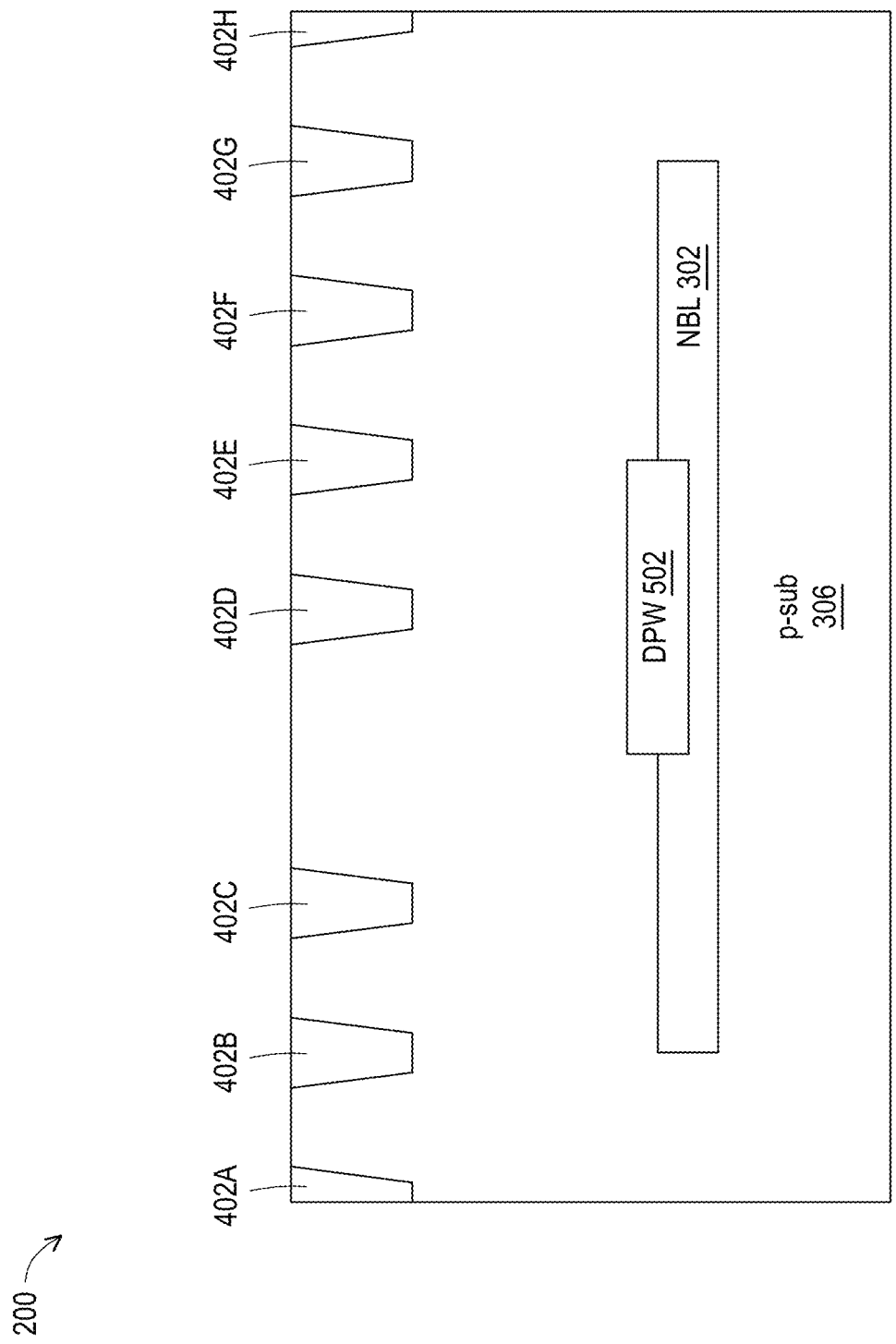

Corresponding to operation 108 of FIG. 1, FIG. 5 is a cross-sectional view of the semiconductor device 200 including a second deep well 502, in accordance with various embodiments. The second deep well 502 is formed above the NBL 302 and doped in p-type (hereinafter "deep p-well (DPW) 502"). The DPW 502 is also buried in the substrate 306, which may sometimes be referred to as p-buried layer (PBL).

The DPW 502 may formed by various ion implantation processes. For example, at least one ion implantation process is performed on the p-substrate 306 to form the DPW 502. Alternatively, the DPW 502 may be a portion of an epitaxy layer such as a silicon epitaxy layer formed by epitaxy processing. The DPW 502 may have p-type dopants such as boron at a concentration of about $10^{12}$ to about $10^{13}$ $\mu m^{-2}$.

Figure 6:
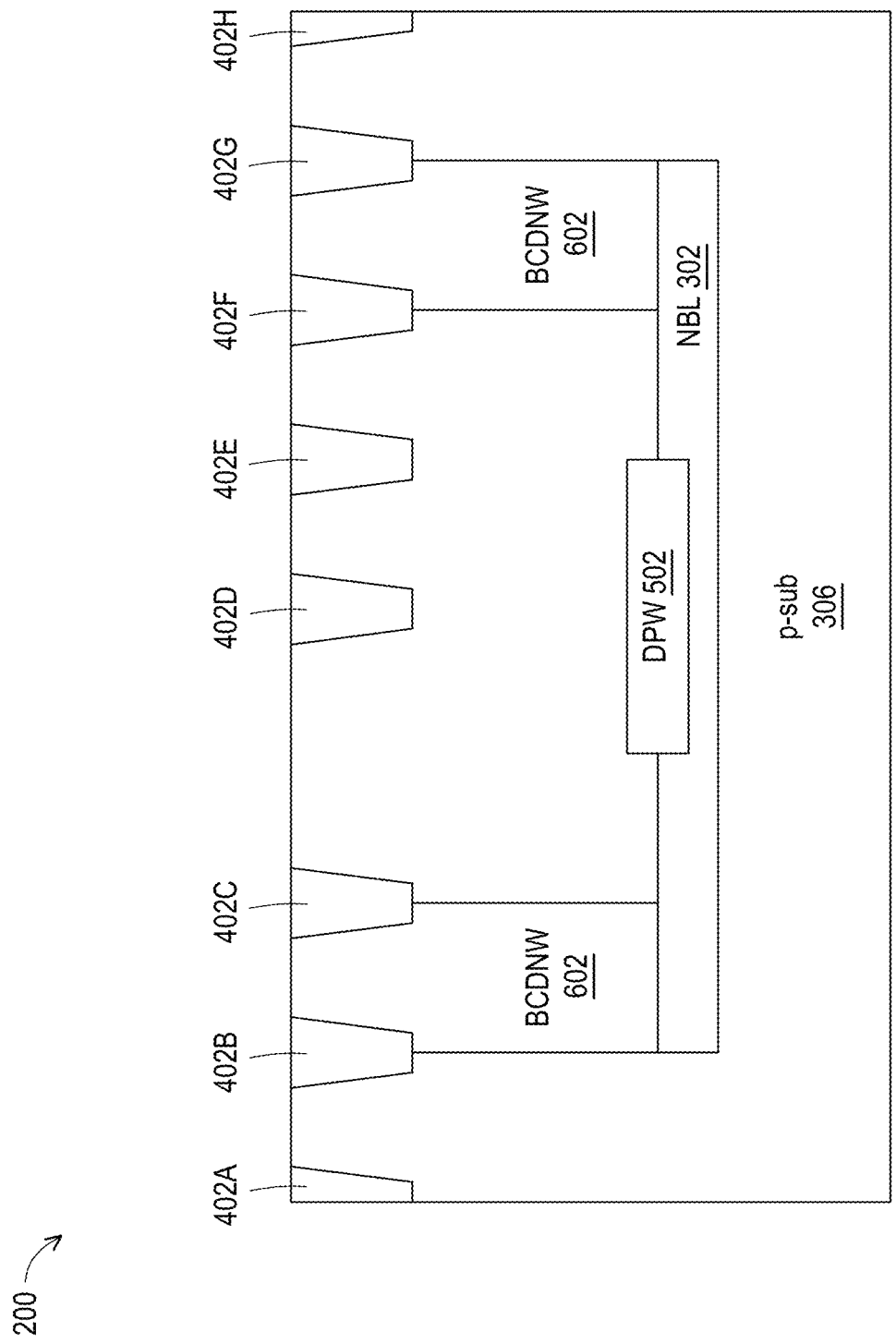

Corresponding to operation 110 of FIG. 1, FIG. 6 is a cross-sectional view of the semiconductor device 200 including a first medium well 602, in accordance with various embodiments. The first medium well 602 is formed above the NBL 302 and doped in n-type (hereinafter "BCDNW 602").

In some embodiments, the BCDNW 602 may be formed as a ring structure (when viewed from the top). For example in the cross-sectional view of FIG. 6, the BCDNW 602 is formed between the STI structures 402B-C and between the STI structures 402F-G. The BCDNW 602 may formed by various ion implantation processes. For example, with a patterned mask layer disposed over the workpiece, at least one ion implantation process is performed on the p-substrate 306. The BCDNW 602 may have n-type dopants such as phosphorus at a concentration of about $10^{12}$ to about $10^{13}$ $\mu m^{-2}$.

Figure 7:
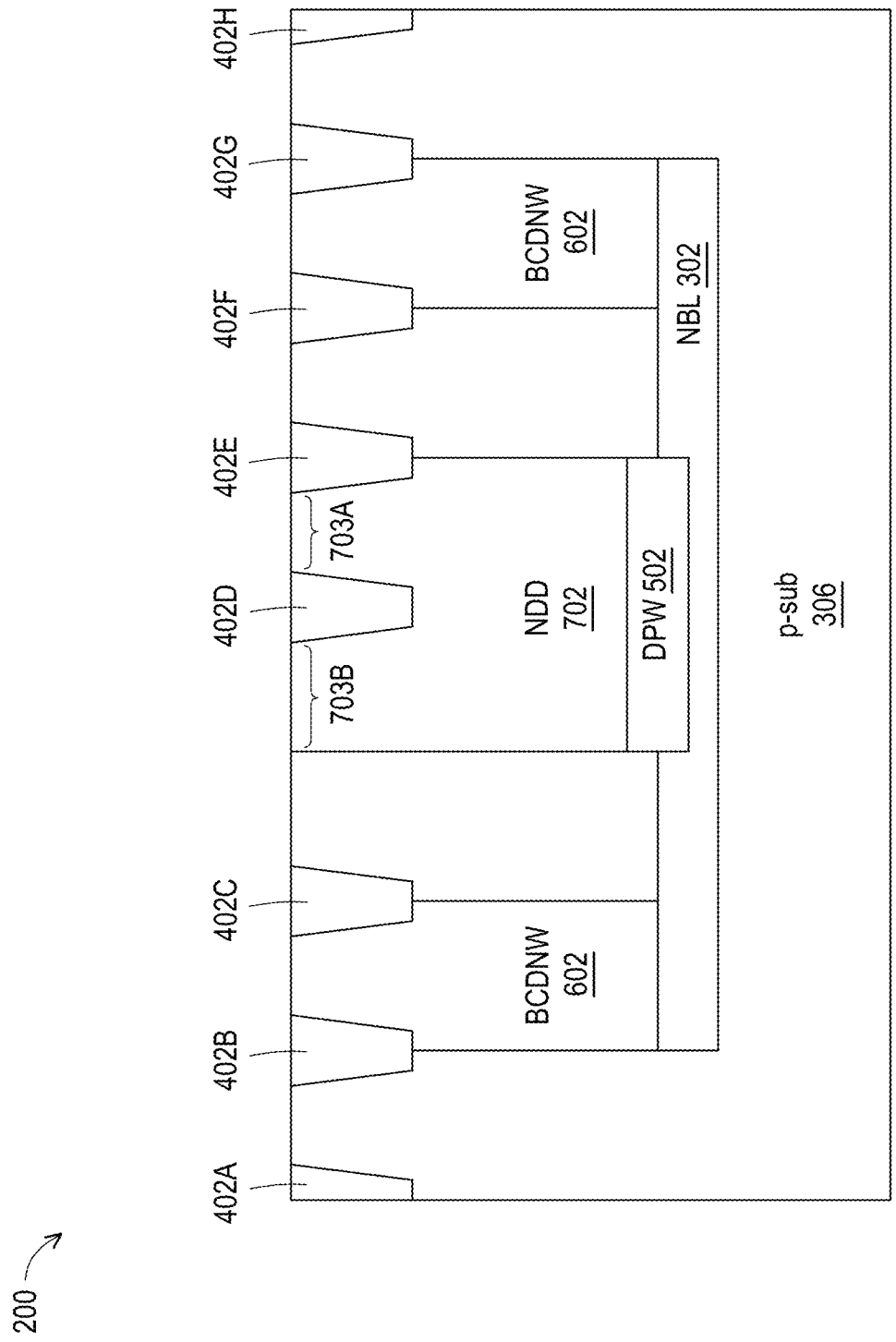

Corresponding to operation 112 of FIG. 1, FIG. 7 is a cross-sectional view of the semiconductor device 200 including a well 702, in accordance with various embodiments. The well 702 is formed above the DPW 502 and doped in n-type (hereinafter "NDD 702"). The NDD 702 may be configured as the drift region of a power transistor (e.g., the semiconductor device 200), which is configured to alleviate the high voltage between a drain (terminal) and source (terminal) of the power transistor. Accordingly, the power transistor can have a substantially high breakdown voltage. The NDD 702 may sometimes be referred to as "drift region 702."

In some embodiments, the NDD 702 may be formed between the STI structures 402C-E. Specifically, a first interface between the NDD 702 and the p-substrate 306 may be disposed between the STI structures 402C and 402D, and a second interface between the NDD 702 and the p-substrate 306 may be disposed below the STI structure 402E. As such, the NDD 702 may have a first portion of its top surface 703A interposed between the STI structures 402D and 402E, a second portion of the top surface 703B disposed opposite the STI structure 402D from the first portion 703A. A bottom surface of the NDD 702 may be in contact with a top surface of the DPW 502. The NDD 702 may have n-type dopants such as phosphorus at a concentration of about $10^{12}$ to about $10^{13}$ $\mu m^{-2}$.

Figure 8:
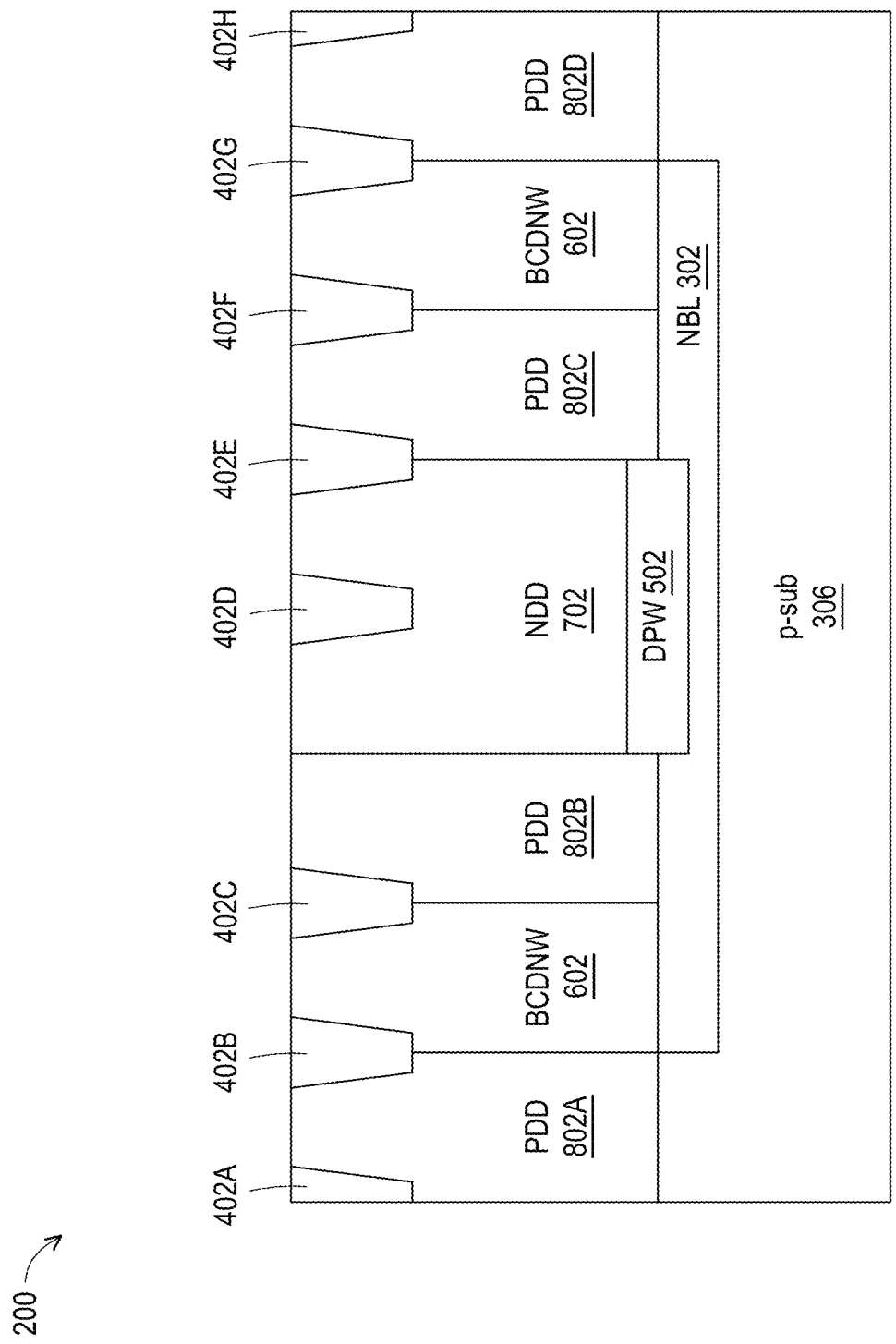

Corresponding to operation 114 of FIG. 1, FIG. 8 is a cross-sectional view of the semiconductor device 200 including a number of second medium wells 802A, 802B, 802C, and 802D, in accordance with various embodiments. The second medium wells 802A to 802D are formed above the NBL 302 and doped in p-type (hereinafter "PDD 802A," "PDD 802B," "PDD 802C," and "PDD 802D," respectively). Such PDDs 802A to 802D may sometimes be collectively referred to as "PDDs 802."

In some embodiments, the PDD 802A and PDD 802D may be collectively formed as a ring structure (when viewed from the top). For example in the cross-sectional view of FIG. 8, the PDD 802A is formed between the STI structures 402A-B, and the PDD 802D is formed between the STI structures 402G-H. Similarly, the PDD 802B and PDD 802C may be collectively formed as another ring structure (when viewed from the top). For example in the cross-sectional view of FIG. 8, the PDD 802B is formed between the STI structure 402C and one sidewall of the NDD 702, and the PDD 802C is formed between the STI structures 402E-F. The PDDs 802 may formed by various ion implantation processes. For example, with a patterned mask layer disposed over the workpiece, at least one ion implantation process is performed on the p-substrate 306. The PDDs 802 may have p-type dopants such as boron at a concentration of about $10^{12}$ $\mu m^{-2}$.

Figure 9:
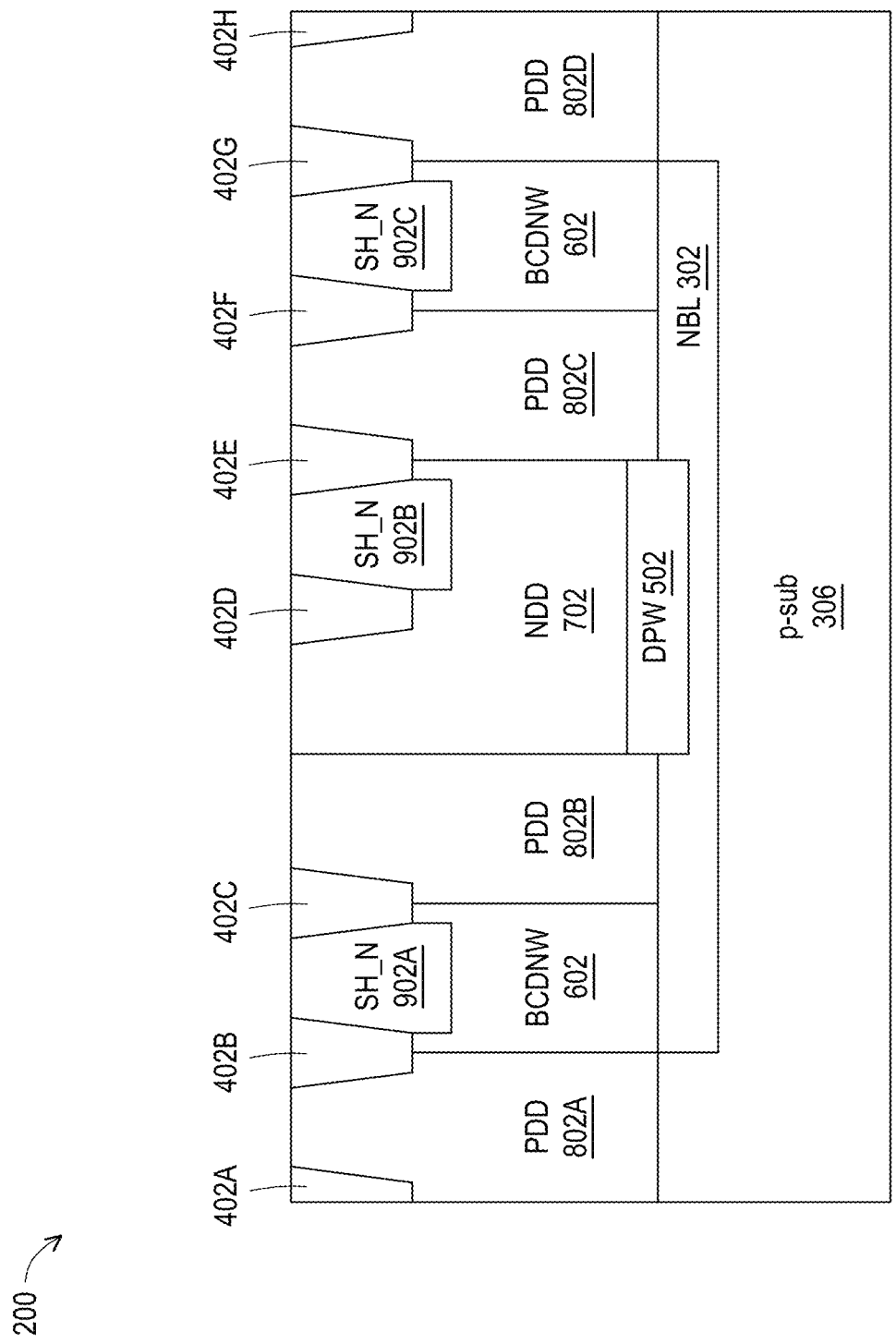

Corresponding to operation 116 of FIG. 1, FIG. 9 is a cross-sectional view of the semiconductor device 200 including a number of first shallow wells 902A, 902B, and 902C, in accordance with various embodiments. The first shallow wells 902A to 902C are formed in the BCDNW 602, NDD 702, and BCDNW 602, respectively, and doped in n-type (hereinafter "SH_N 902A," "SH_N 902B," and "SH_N 902C," respectively). Such SH_N 902A to 902C may sometimes be collectively referred to as "SH_Ns 902."

In some embodiments, the SH_N 902A and SH_N 902C may be collectively formed as a ring structure (when viewed from the top). For example in the cross-sectional view of FIG. 9, the SH_N 902A is formed between the STI structures 402B-C, and the SH_N 902C is formed between the STI structures 402F-G. The SH_N 902B is formed in the NDD 702 and between the STI structures 402D and 402E. The SH_Ns 902 may formed by various ion implantation processes. For example, with a patterned mask layer disposed on the workpiece, at least one ion implantation process is performed on the BCDNW 602 and the NDD 702, respectively, to form the SH_Ns 902. The SH_Ns 902 may have n-type dopants such as phosphorous at a concentration of about $10^{13}$ $\mu m^{-2}$.

Figure 10:
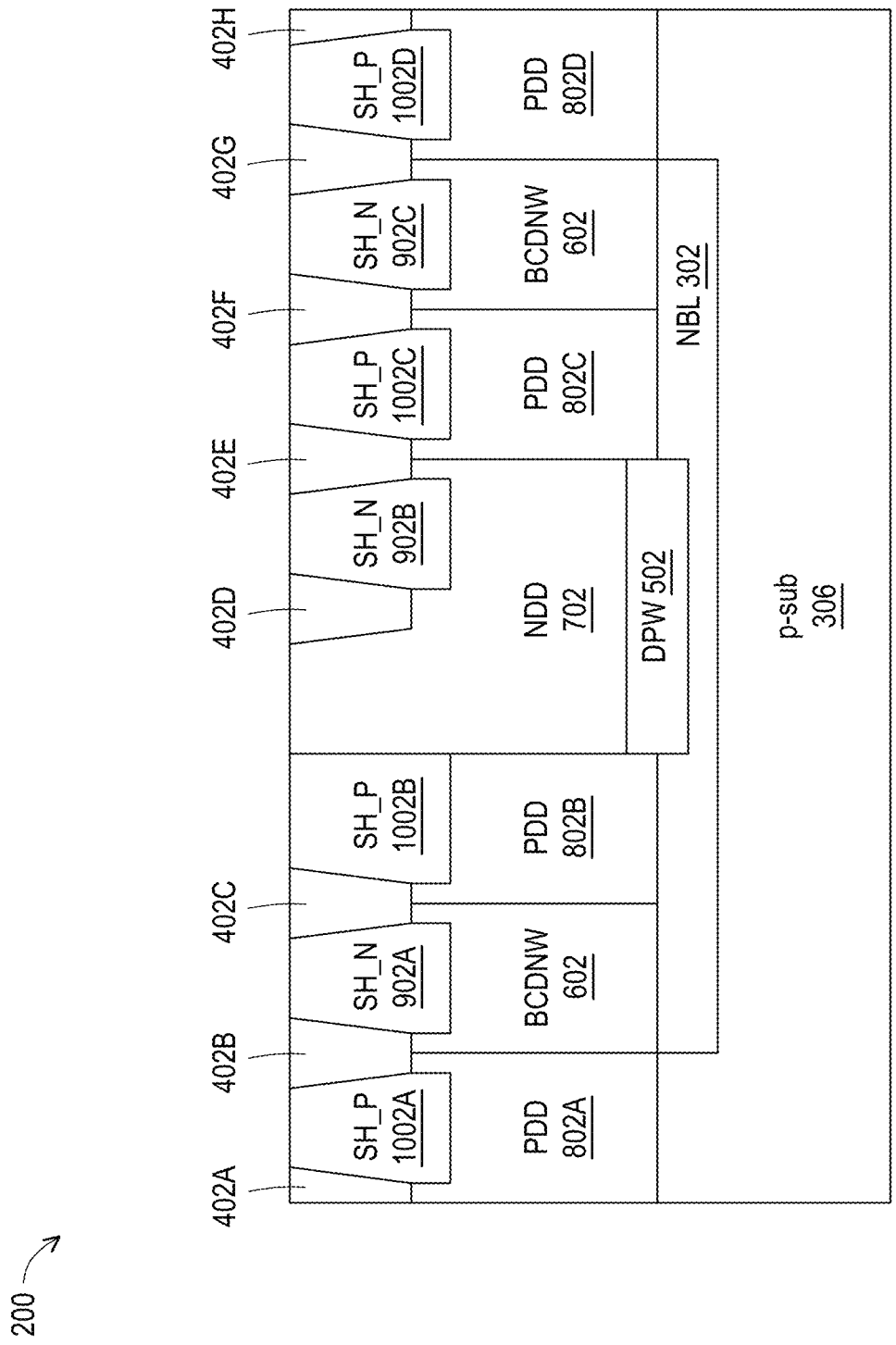

Corresponding to operation 118 of FIG. 1, FIG. 10 is a cross-sectional view of the semiconductor device 200 including a number of second shallow wells 1002A, 1002B, 1002C, and 1002D, in accordance with various embodiments. The second shallow wells 1002A to 1002D are formed in the PDD 802A, PDD 802B, PDD 802C, and PDD 802D, respectively, and doped in p-type (hereinafter "SH_P 1002A," "SH_P 1002B," "SH_P 1002C," and "SH_P 1002D," respectively). Such SH_P 1002A to 1002D may sometimes be collectively referred to as "SH_Ps 1002."

In some embodiments, the SH_P 1002A and SH_P 1002D may be collectively formed as a ring structure (when viewed from the top). For example in the cross-sectional view of FIG. 10, the SH_P 1002A is formed between the STI structures 402A-B, and the SH_P 1002D is formed between the STI structures 402G-H. Similarly, the SH_P 1002B and SH_P 1002C may be collectively formed as another ring structure (when viewed from the top). For example in the cross-sectional view of FIG. 10, the SH_P 1002B is formed between the STI structure 402C and one sidewall of the NDD 702, and the SH_P 1002C is formed between the STI structures 402E-F. The SH_Ps 1002 may formed by various ion implantation processes. For example, with a patterned mask layer disposed on the workpiece, at least one ion implantation process is performed on the PDDs 802A to 802D, respectively, to form the SH_Ps 1002. The SH_Ps 1002 may have p-type dopants such as boron at a concentration of about $10^{13}$ $\mu m^{-2}$.

Figure 11:
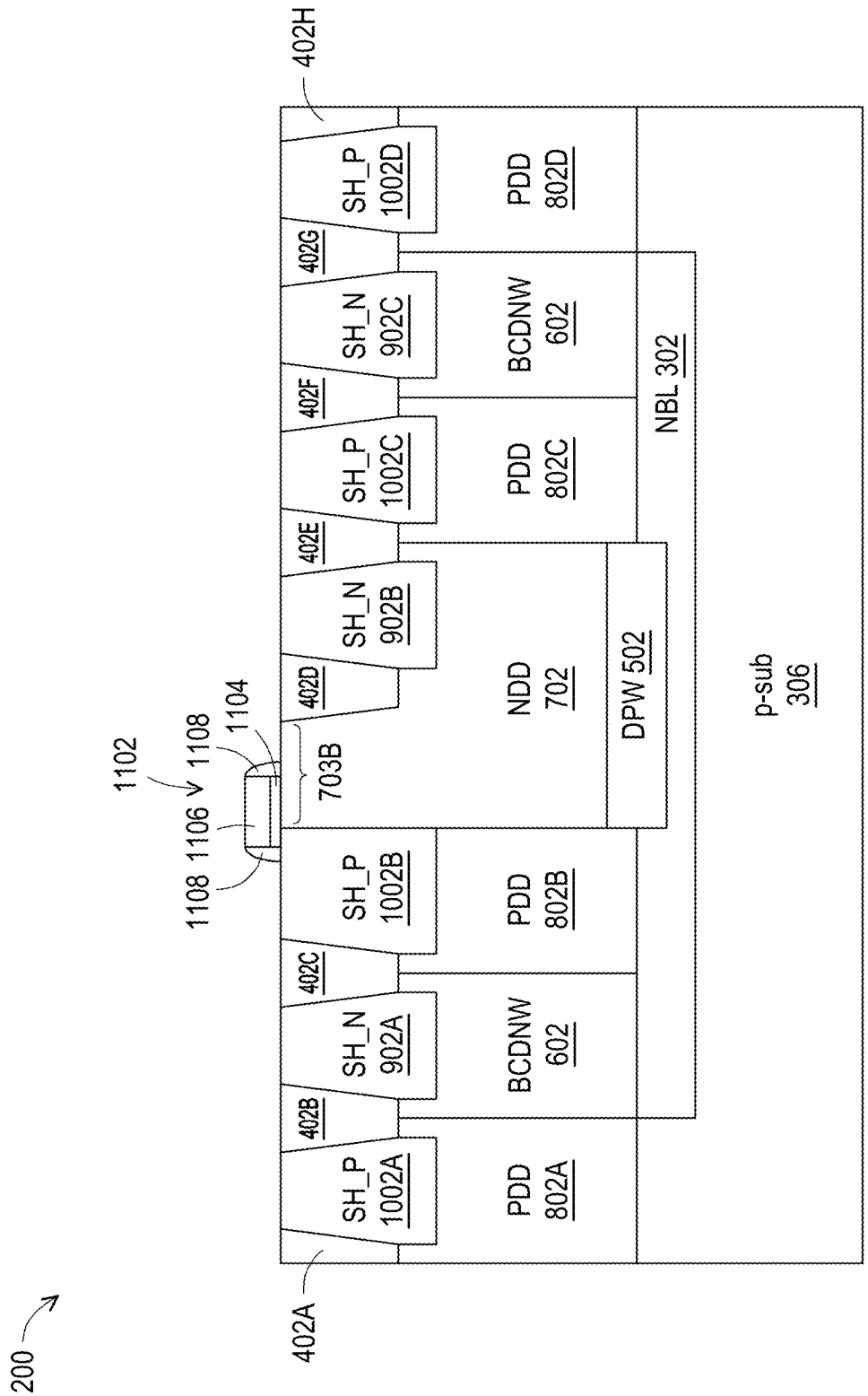

Corresponding to operation 120 of FIG. 1, FIG. 11 is a cross-sectional view of the semiconductor device 200 including a gate structure 1102, in accordance with various embodiments.

As shown in the illustrative example of FIG. 11 (and the following figures), the gate structure 1102 is disposed over the interface between the NDD 702 and the SH_P 1002B. However, it should be understood that a position of the gate structure 1102 may be laterally shifted, as long as the gate structure 1102 is separated from the STI structure 402D with a non-zero distance (which causes the portion of the top surface 703B to be partially exposed). Such an exposed portion of the top surface 703B equivalently reduces a width of the STI structure 402D, which can advantageously lower the conduction/channel resistance (Ron) of the semiconductor device 200. Accordingly, a power transistor implemented by the semiconductor device 200 can have a higher conduction current (sometimes referred to as Idlin or Ion). Further, the exposed portion of the top surface 703B allows one or more field plates to be formed thereon such as to maintain a breakdown voltage of the power transistor at a substantially high level (e.g., over about 20V) and advantageously lower coupling capacitance (e.g., Cgd) of the power transistor, which will be discussed in further detail below.

In some embodiments, the gate structure 1102 includes a gate dielectric layer 1104, a gate conductive layer 1106, and gate spacers 1108 extending along collective sidewalls of the gate dielectric layer 1104 and gate conductive layer 1106.

The gate dielectric layer 1104 may be formed of different high-k dielectric materials or a similar high-k dielectric material. Example high-k dielectric materials include a metal oxide or a silicate of Hf, Al, Zr, La, Mg, Ba, Ti, Pb, and combinations thereof. The gate dielectric layer 1104 may include a stack of multiple high-k dielectric materials. The gate dielectric layer 1104 can be deposited using any suitable method, including, for example, molecular beam deposition (MBD), atomic layer deposition (ALD), PECVD, and the like. In some embodiments, the gate dielectric layer 1104 may optionally include a substantially thin oxide (e.g., $SiO_x$) layer, which may be a native oxide layer formed on the surface of the substrate 306.

The gate conductive layer 1106 may include a doped or non-doped polycrystalline silicon (or polysilicon), formed by CVD, PVD, ALD, plating, and other proper processes. Alternatively, the gate conductive layer 1106 may include a stack of multiple metal layers. For example, the metal layer may be a p-type work function layer, an n-type work function layer, multi-layers thereof, or combinations thereof. The work function layer may also be referred to as a work function metal. Example p-type work function metals may include TiN, TaN, Ru, Mo, Al, WN, $ZrSi_2$, $MoSi_2$, $TaSi_2$, $NiSi_2$, WN, other suitable p-type work function materials, or combinations thereof. Example n-type work function metals may include Ti, Ag, TaAl, TaAlC, TiAlN, TaC, TaCN, TaSiN, Mn, Zr, other suitable n-type work function materials, or combinations thereof.

The gate spacers 1108 may each include a dielectric material such as, for example, silicon oxide. Alternatively, the gate spacers 1108 may each optionally include silicon nitride, silicon carbide, silicon oxynitride, or combinations thereof. Although the gate spacers are each shown having a single layer in the illustrated example of FIG. 11 (and the following figures), it should be understood that the gate spacers 1108 may each be implemented as a multilayer structure, while remaining within the scope of the present disclosure. The gate spacers 1108 may be formed by a deposition and etching (anisotropic etching technique).

Figure 12:
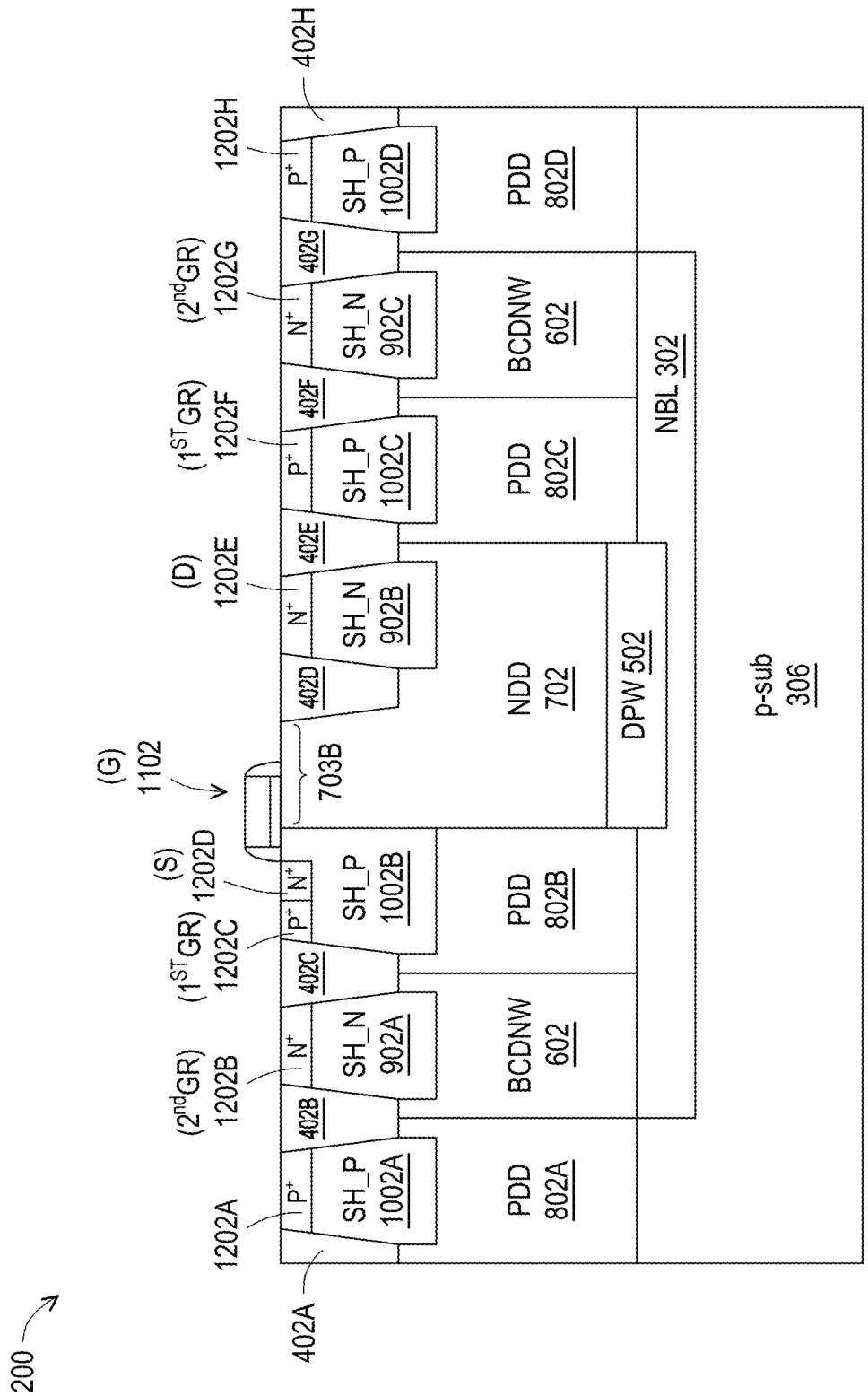

Corresponding to operation 122 of FIG. 1, FIG. 12 is a cross-sectional view of the semiconductor device 200 including a number of contact regions 1202A, 1202B, 1202C, 1202D, 1202E, 1202F, 1202G, and 1202H, in accordance with various embodiments.

In some embodiments, the contact regions 1202A, 1202B, 1202C, 1202D, 1202E, 1202F, 1202G, and 1202H are disposed in the SH_P 1002A, SH_N 902A, SH_P 1002B, SH_P 1002B, SH_N 902B, SH_P 1002C, SH_N 902C, and SH_P 1002D, respectively. Further, the contact regions 1202A, 1202C, 1202F, and 1202H may have p-type dopants such as boron at an elevated concentration of about $10^{18}$ $\mu m^{-2}$, and the contact regions 1202B, 1202D, 1202E, and 1202G may have n-type dopants such as phosphorous at an elevated concentration of about $10^{18}$ $\mu m^{-2}$. Accordingly, the contact regions 1202A, 1202C, 1202F, and 1202H may sometimes referred to as "p+ regions," and the contact regions 1202B, 1202D, 1202E, and 1202G may sometimes referred to as "n+ regions."

In some embodiments, with the gate structure 1102 operatively functioning as a gate (terminal) of the semiconductor device 200 (e.g., a power transistor), the contact regions 1202D and 1202E may operatively function as a source (terminal) and a drain (terminal) of the power transistor 200, respectively. As shown, the drain terminal 1202E is pushed farther away from the gate structure 1102 than the source terminal 1202D, so as to allow the drift region 702 to sustain a substantially high breakdown voltage. Further, in some embodiments, the contact regions 1202C and 1202F may form a first guard ring (e.g., a first ring structure) for the power transistor 200, and the contact regions 1202B and 1202G may form a second guard ring (e.g., a second ring structure) for the power transistor 200. The first guard ring (1202C together with 1202F) and second guard ring (1202B together with 1202G) can equivalently form an NPN parasitic transistor that prevents leakage current, at an interface between the PDD 802C and the BCDNW 602, and at an interface between the NBL 302 and the DPW 502, as examples. Still further, the contact regions 1202A and 1202H may be formed as yet another ring structure electrically coupled to the substrate, e.g., p-substrate 306.

Figure 13:
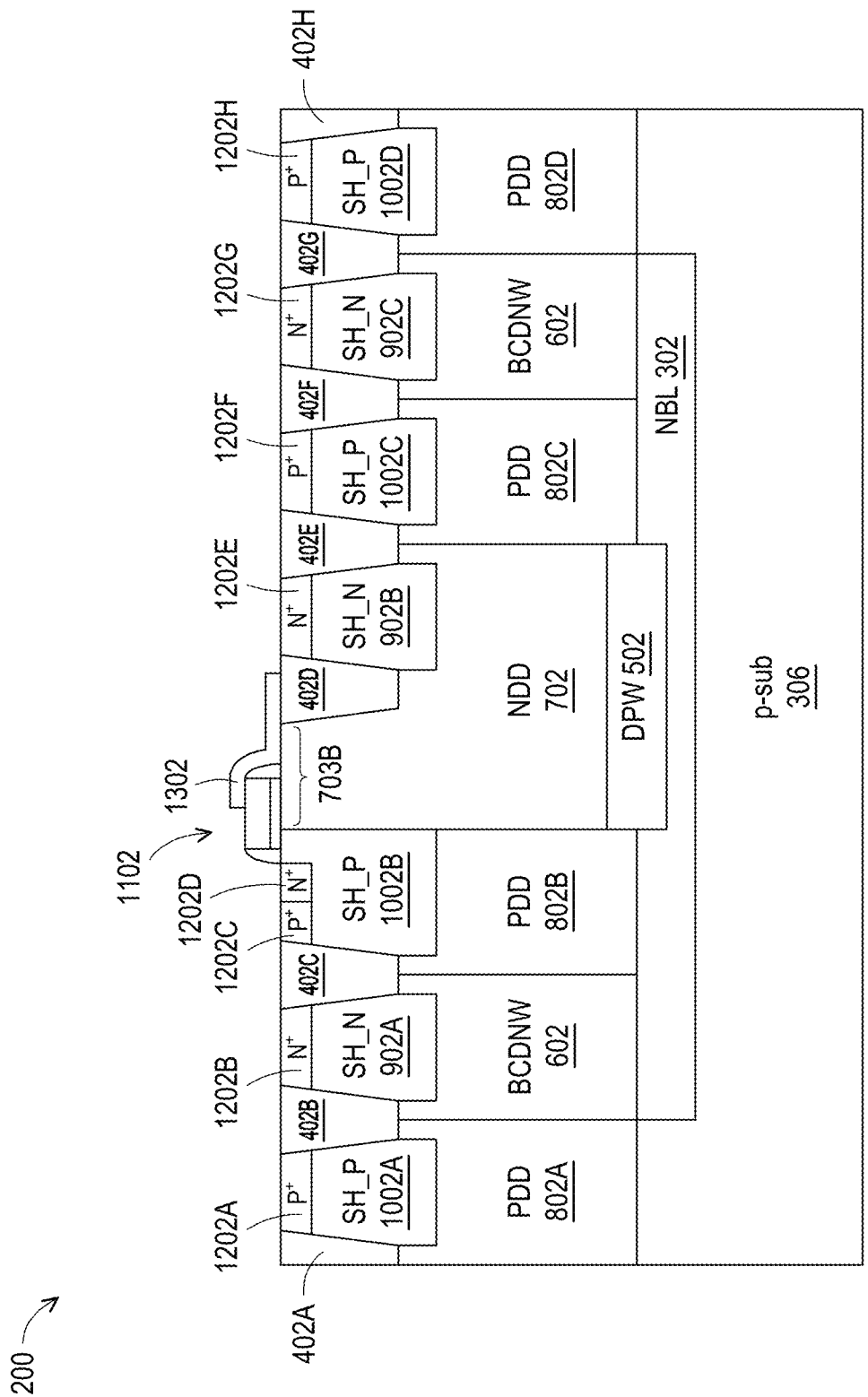

Corresponding to operation 124 of FIG. 1, FIG. 13 is a cross-sectional view of the semiconductor device 200 including a resist protective oxide (RPO) layer 1302, in accordance with various embodiments.

As shown, the RPO layer 1302 may be formed to overlay a portion of the gate structure 1102, extend along a sidewall of the gate structure 1102, overlay a portion of the top surface 703B, and overlay a portion of the STI structure 402D. The RPO layer 1302 can function as a silicide blocking layer during a subsequent salicide process. The RPO layer 1302 may be first formed as a blanket layer. Next, the blanket layer may be patterned to have a profile as shown (e.g., where a silicide layer is not to be formed). The RPO layer 1302 is generally formed of silicon oxide. In some embodiments, the silicon oxide used to form the RPO layer 1302 may have a greater porosity than the oxide filled in the STI structures 402. Alternatively, the RPO layer 1302 may include a dielectric material selected from the group consisting of: silicon nitride, silicon oxy-nitride, oxygen-doped silicon nitride, nitrided oxides, and combinations thereof.

With the formation of the RPO layer 1302, a gradient of oxide (or dielectric) thickness over the drift region 702 can be present. For example, with the STI structure 402D having a thickest oxide thickness and the gate dielectric layer 1104 having a thinnest oxide thickness, the RPO layer 1302 may have a thickness between these two thicknesses. As such, electric field within the drift region 702 can be further smoothed, which may advantageously increase or maintain the originally high breakdown voltage of the semiconductor device 200.

Figure 14:
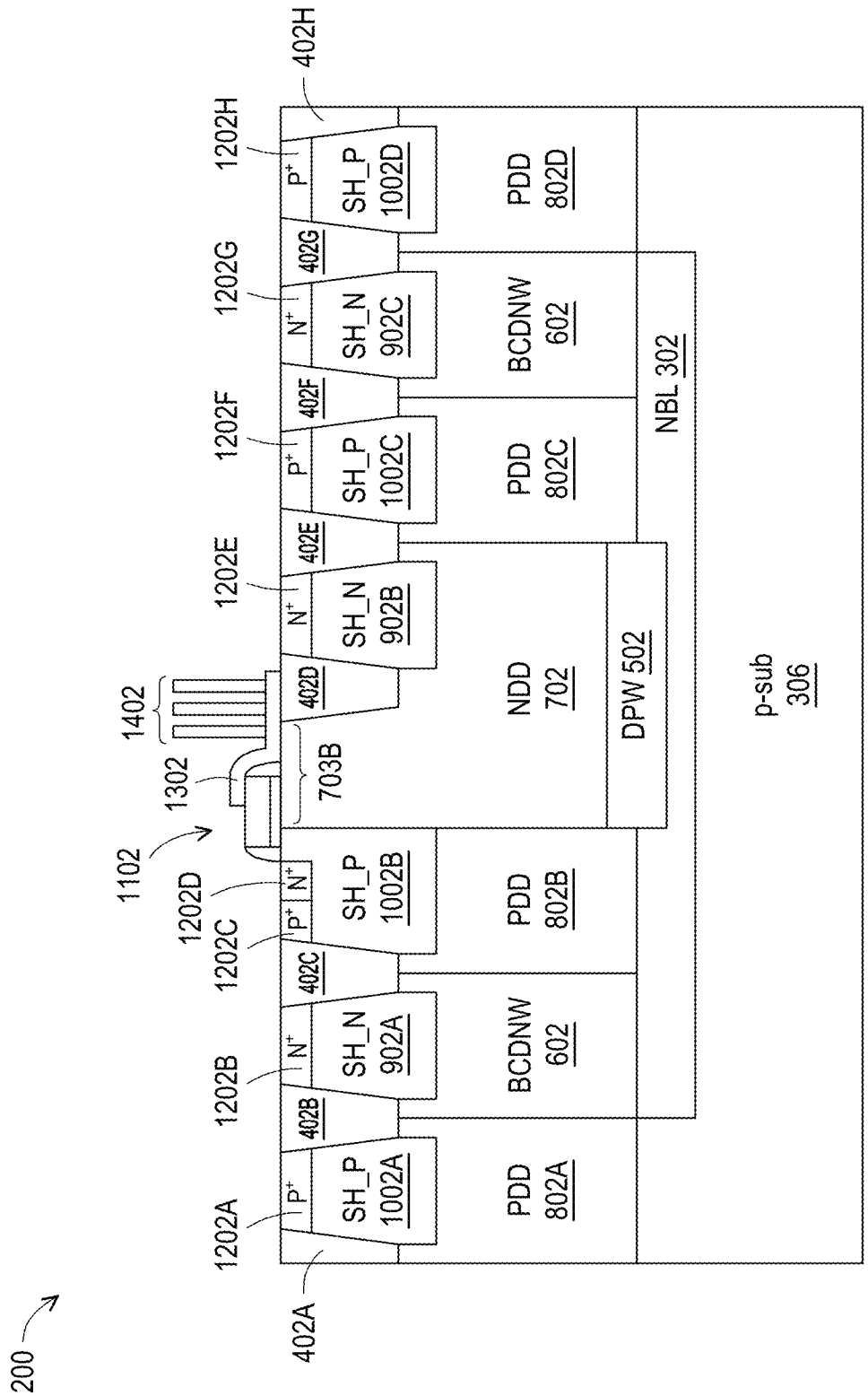

Corresponding to operation 126 of FIG. 1, FIG. 14 is a cross-sectional view of the semiconductor device 200 including a number of (contact) field plates 1402, in accordance with various embodiments.

In some embodiments, the field plates 1402 can also smooth distribution of the electrical field in the drift region 702 and thus to further increase or maintain the originally high breakdown voltage of the power transistor 200 (e.g., above about 20V). As shown in the cross-sectional view of FIG. 14, the field plates 1402 are formed above the RPO layer 1302. For example, some of the field plates 1402 may be formed over the portion of the top surface 703B not overlaid by the gate structure 1102, while some of the field plates 1402 may be formed over the STI structure 402D. The filed plates 1402 may each be formed as a conductive (e.g., metal) structure vertically extending from the RPO layer 1302. For example, the field plates 1402 may include a metal/metallic material selected from the group consisting of: tungsten, copper, aluminum, cobalt, titanium, tantalum, titanium nitride, tantalum nitride, and combinations thereof. Further, when viewed from the top, the field plates 1402 can form a one-dimensional or two-dimensional array. For example, the field plates 1402 may be arranged along a single lateral direction. In another example, the field plates 1402 may be arranged across multiple rows and columns (i.e., spanning over at least two lateral directions).

Figure 15:
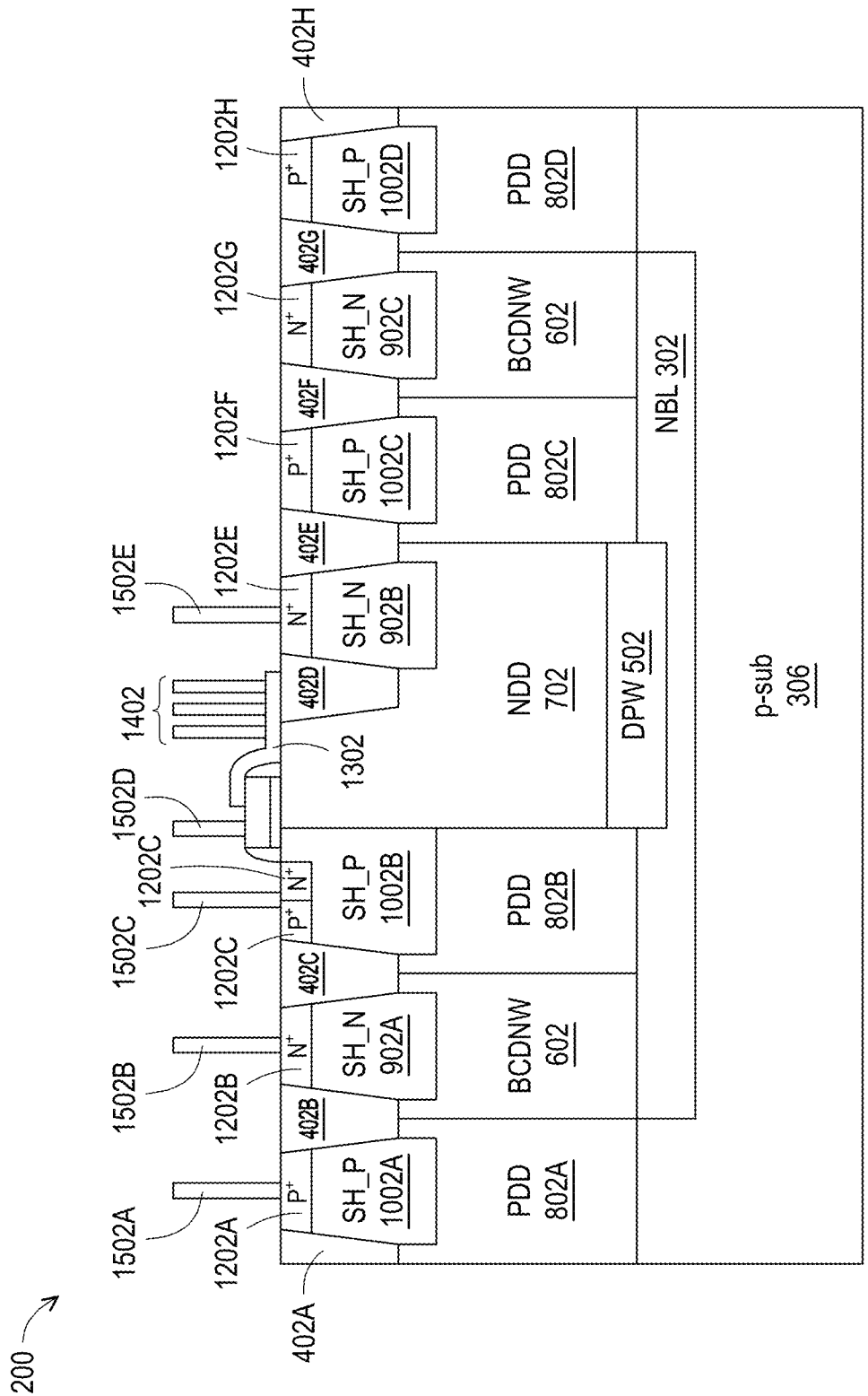

Corresponding to operation 128 of FIG. 1, FIG. 15 is a cross-sectional view of the semiconductor device 200 including a number of contacts 1502A, 1502B, 1502C, 1502D, and 1502E, in accordance with various embodiments.

The contacts 1502A, 1502B, 1502C, 1502D, and 1502E may be formed to electrically connect the contact region 1202A, contact region 1202B, contact region 1202C together with contact region 1202D, gate structure 1102, and contact region 1202E, respectively, to corresponding conductive features. Accordingly, the contacts 1502C, 1502D, and 1502E connected to the source, gate, and drain, may sometimes be referred to as "source contact 1502C," "gate contact 1502D," and "drain contact 1502E," respectively. As mentioned above, the contact regions 1202C and 1202F may be formed as a ring structure, such that the contact 1502C may also be electrically connected to the contact region 1202F. Similarly, the contact 1502B may also be electrically connected to the contact region 1202G in addition to the contact region 1202B, and the contact 1502A may also be electrically connected to the contact region 1202A in addition to the contact region 1202H. In some embodiments, each of the contacts 1502A to 1502E may be formed as a via structure that is formed of a conductive (e.g., metal) material such as, for example, tungsten, copper, aluminum, cobalt, or combinations thereof.

Figure 16:
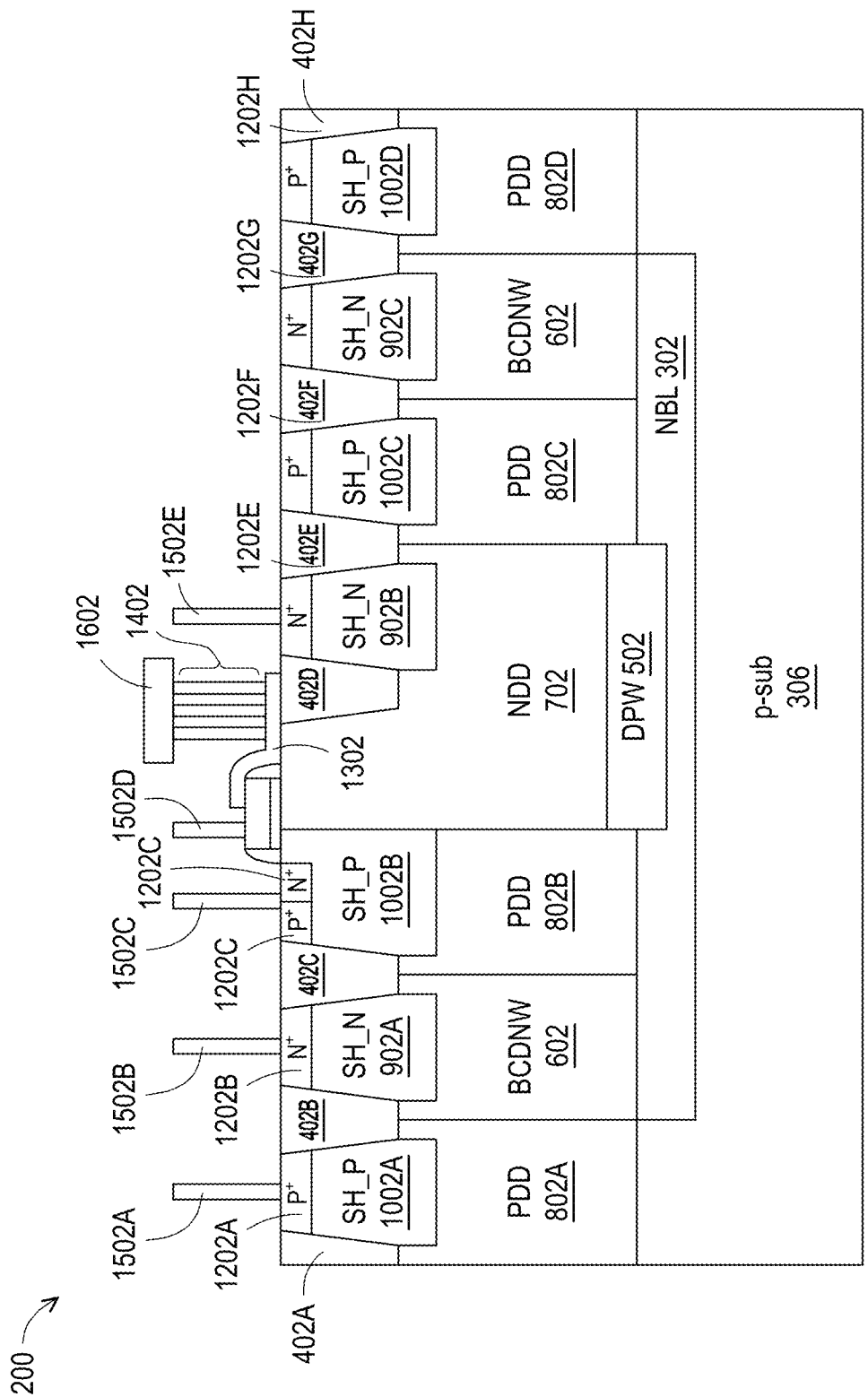

Corresponding to operation 130 of FIG. 1, FIG. 16 is a cross-sectional view of the semiconductor device 200 including a number of conductive lines, e.g., 1602, in accordance with various embodiments.

In some embodiments, upon forming the various device features (e.g., gate structures, contact regions, deep/medium/shallow wells, etc.) which are typically referred to as part of front-end-of-line (FEOL) networking, the semiconductor device 200 may further includes a number of metallization layers formed over the FEOL networking, which are typically referred to as back-end-of-line (BEOL) networking. Each of the metallization layers includes a dielectric material (e.g., silicon oxide or otherwise low-k dielectric materials), with a number of conductive lines and a number of via structures (e.g., both including a metal material) formed therein. As shown in FIG. 16, the conductive line 1602 may be formed in a bottommost one of the metallization layers (sometimes referred to as "M1" layer). The conductive line 1602 can be electrically connected to the field plates 1402.

Figure 17:
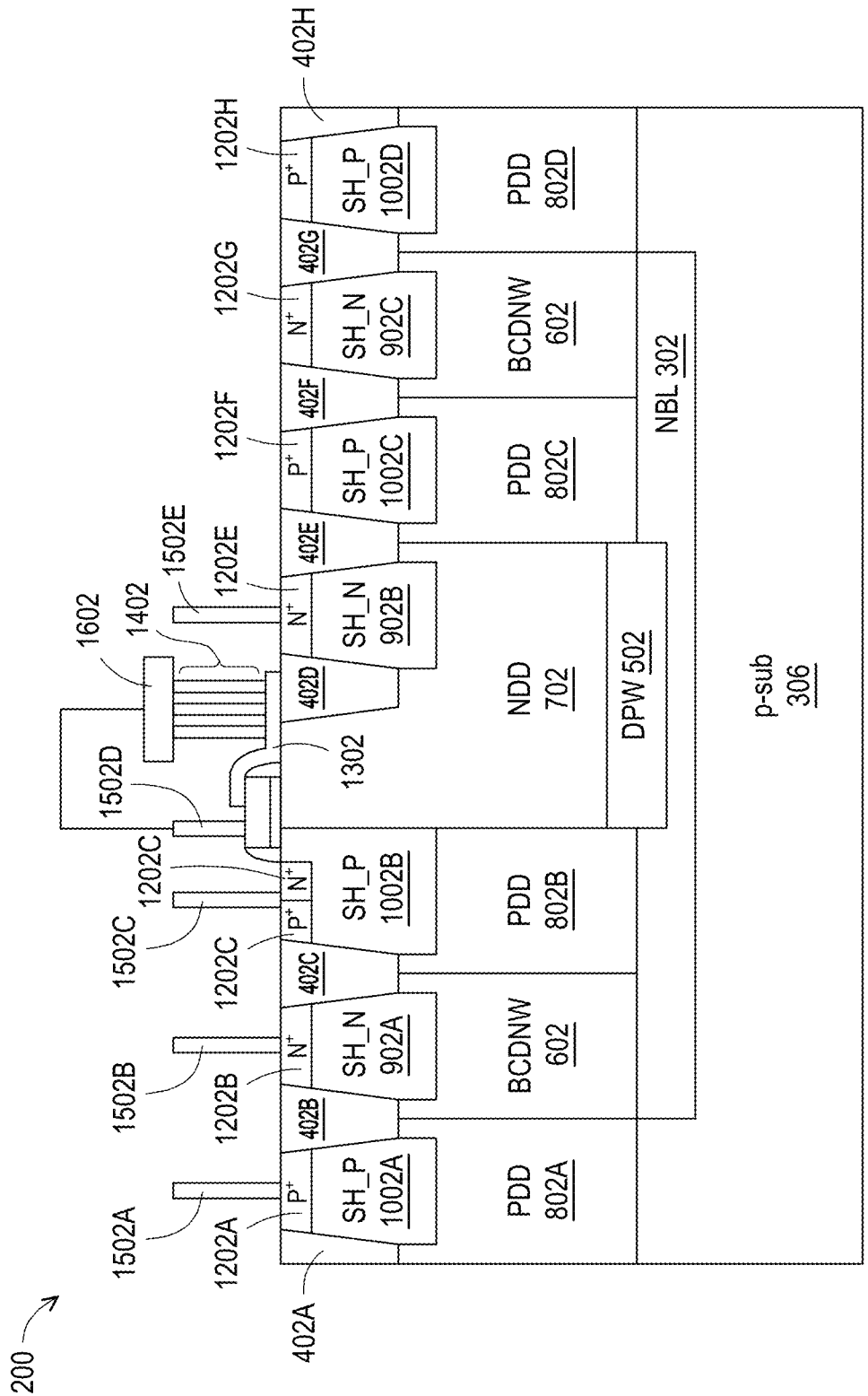
Figure 18:
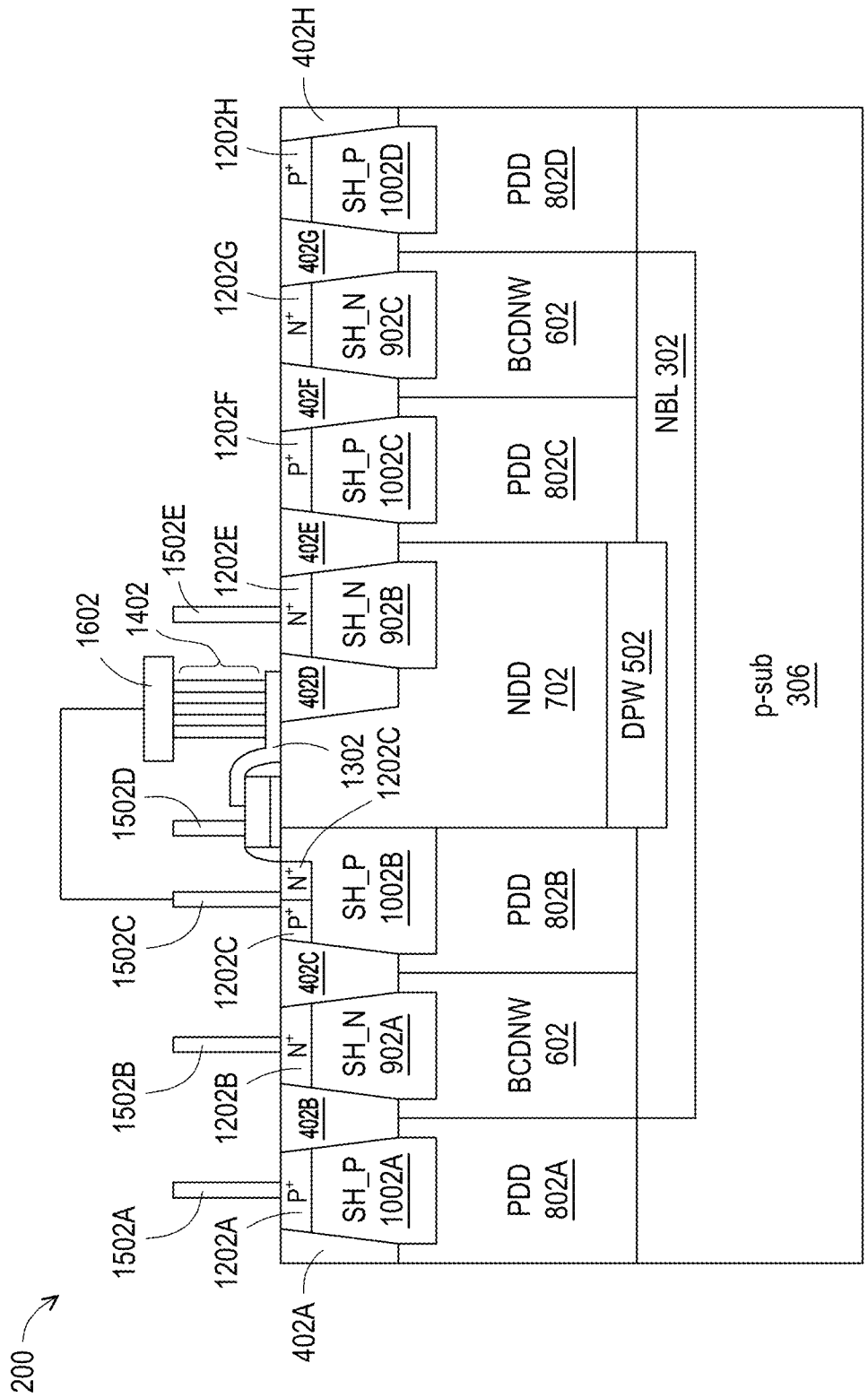

Corresponding to operation 132 of FIG. 1, FIG. 17 is a cross-sectional view of the semiconductor device 200 in which the field plates 1402 are electrically coupled to the gate contact 1502D, and FIG. 18 is a cross-sectional view of the semiconductor device 200 in which the field plates 1402 are electrically coupled to the source contact 1502C, in accordance with various embodiments.

By electrically coupling the field plates 1402 to the gate contact 1502D (FIG. 17) or the source contact 1502C (FIG. 18), the capacitance coupled between the gate structure and drain region (Cgd) can be further dragged to a lower value (e.g., about 25% lower), which can advantageously improve performance of the semiconductor device 200 in the high-frequency range (e.g., in the range of megahertz). In some embodiments, the coupling between the field plates and one or more other contacts/terminals can be realized by a number of the conductive lines and a number of the via structures in the BEOL networking (e.g., conductive line 1602 and various other conductive features). Although FIGS. 17-18 respectively illustrate coupling the field plates 1402 to the gate contact 1502D and the source contact 1502C, it should be understood that the field plates 1402 can be coupled to other contacts, while remaining within the scope of the present disclosure. For example, the field plates 1402 can be electrically coupled to the contact 1502A (thereby coupled to the first guard ring) or the contact 1502B (thereby coupled to the second guard ring).

In one aspect of the present disclosure, a semiconductor device is disclosed. The semiconductor device includes a semiconductor substrate. The semiconductor device includes a first well of a first conductivity type near a surface of the semiconductor substrate. The semiconductor device includes a second well of a second conductivity type near the surface of the semiconductor substrate, the first well and the second well being separated from each other. The semiconductor device includes a transistor comprising: (i) a first source/drain region formed in the first well; (ii) a second source/drain region formed in the second well; and (iii) a gate structure formed near the surface of the semiconductor substrate and separated from the second source/drain region at least with a portion of a third well of the second conductive type. The semiconductor device includes an isolation structure formed near the surface of the semiconductor substrate and further separating the second source/drain region from the gate structure. The semiconductor device includes a plurality of field plates formed above at least one of the portion of the third well or the isolation structure.

In another aspect of the present disclosure, a semiconductor device is disclosed. The semiconductor device includes a semiconductor substrate. The semiconductor device includes a first well of a first conductivity type formed near a surface of the semiconductor substrate. The semiconductor device includes a second well of a second conductivity type formed near the surface of the semiconductor substrate, the first well and the second well being separated from each other. The semiconductor device includes a third well of the second conductive type formed near the surface of the semiconductor substrate, the third well including the second well and abutted to the first well. The semiconductor device includes an isolation structure formed near the surface of the semiconductor substrate and between an interface of the third well and the second well. The semiconductor device includes a high-voltage transistor comprising: (i) a first source/drain region formed in the first well; (ii) a second source/drain region formed in the second well; and (iii) a gate structure formed above the first well and the third well. The semiconductor device includes a plurality of field plates electrically coupled to one of the first source/drain region or the gate structure.

In yet another aspect of the present disclosure, a method for fabricating semiconductor devices is disclosed. The method includes forming a shallow trench isolation (STI) structure along a surface of a semiconductor substrate. The method includes forming a first well with a first conductivity type in the semiconductor substrate, the first well including the STI structure. The method includes forming a second well with a second conductive type abutting the first well. The method includes forming a third well with the first conductive type in the first well, the second well being separated from the STI structure with a first portion of the first well, and the third well being abutted to the STI structure. The method includes forming a source region in the second well. The method includes forming a drain region in the third well. The method includes forming a gate structure overlaying at least a second portion of the first well, the first portion further comprising a third portion laterally between the second portion and the STI structure. The method includes forming a plurality of field plates over at least one of the third portion of the first well or the STI structure.

As used herein, the terms "about" and "approximately" generally mean plus or minus 10% of the stated value. For example, about 0.5 would include 0.45 and 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a semiconductor substrate;
   a first well of a first conductivity type near a surface of the semiconductor substrate;
   a second well of a second conductivity type near the surface of the semiconductor substrate, the first well and the second well being separated from each other;
   a transistor comprising: (i) a first source/drain region formed in the first well; (ii) a second source/drain region formed in the second well; and (iii) a gate structure formed near the surface of the semiconductor substrate and separated from the second source/drain region at least with a portion of a third well of the second conductive type, a bottom portion of the third well being below a bottom portion of the second well;
   an isolation structure formed near the surface of the semiconductor substrate and further separating the second source/drain region from the gate structure; and
   a plurality of field plates formed above at least one of the portion of the third well or the isolation structure.

2. The semiconductor device of claim 1, wherein the isolation structure comprises a material selected from a group consisting of: silicon oxide, hafnium oxide, undoped silicate glass, and combinations thereof.

3. The semiconductor device of claim 1, wherein the plurality of field plates are each formed of a metal material.

4. The semiconductor device of claim 1, wherein, when viewed from a top surface of the semiconductor device, the plurality of field plates are formed as an array.

5. The semiconductor device of claim 1, further comprising:
   a resist protective oxide layer overlaying a portion of the gate structure, extending along one sidewall of the gate structure, and overlaying the portion of the third well and a portion of the isolation structure; and
   a conductive line formed in a metallization layer.

6. The semiconductor device of claim 5, wherein the plurality of field plates each extend from the resist protective oxide layer to the conductive line.

7. The semiconductor device of claim 5, the plurality of field plates each extend from a portion of the resist protective oxide layer, that is disposed above the portion of the third well or the portion of the isolation structure, to the conductive line.

8. The semiconductor device of claim 1, wherein the plurality of field plates are electrically coupled to the gate structure.

9. The semiconductor device of claim 1, wherein the plurality of field plates are electrically coupled to the first source/drain region.

10. The semiconductor device of claim 1, wherein the gate structure is laterally separated apart from the isolation structure with a non-zero distance.

11. A semiconductor device, comprising:
    a semiconductor substrate;
    a first well of a first conductivity type formed near a surface of the semiconductor substrate;
    a second well of a second conductivity type formed near the surface of the semiconductor substrate, the first well and the second well being separated from each other;
    a third well of the second conductive type formed near the surface of the semiconductor substrate, the third well including the second well and abutted to the first;
    an isolation structure formed near the surface of the semiconductor substrate and between an interface of the third well and the second well;
    a high-voltage transistor comprising: (i) a first source/drain region formed in the first well; (ii) a second source/drain region formed in the second well; and (iii) a gate structure formed above the first well and the third well, wherein the isolation structure is laterally separated from the gate structure with a portion of the third well; and
    a plurality of field plates electrically coupled to one of the first source/drain region or the gate structure.

12. The semiconductor device of claim 11, wherein the plurality of field plates are formed above at least one of the portion of the third well or a portion of the isolation structure.

13. The semiconductor device of claim 11, wherein the isolation structure comprises a material selected from a group consisting of: silicon oxide, hafnium oxide, undoped silicate glass, and combinations thereof.

14. The semiconductor device of claim 11, wherein the plurality of field plates are each formed of a metal material.

15. The semiconductor device of claim 11, wherein, when viewed from a top surface of the semiconductor device, the plurality of field plates are formed as an array.

16. The semiconductor device of claim 11, further comprising:
    a resist protective oxide layer overlaying a portion of the gate structure, extending along one sidewall of the gate structure, overlaying a portion of the third well that is laterally interposed between the gate structure and the isolation structure, and overlaying a portion of the isolation structure; and a conductive line formed in a metallization layer.

17. The semiconductor device of claim 16, wherein the plurality of field plates each vertically extend from the resist protective oxide layer to the conductive line.

18. A semiconductor device, comprising:

a semiconductor substrate;

a first well of a first conductivity type formed near a surface of the semiconductor substrate;

a second well of a second conductivity type formed near the surface of the semiconductor substrate;

a third well of the second conductive type formed near the surface of the semiconductor substrate, the third well interfacing with a bottom surface of the second well;

a high-voltage transistor comprising: (i) a first source/drain region formed in the first well; (ii) a second source/drain region formed in the second well; and (iii) a gate structure formed above the first well and the third well;

an isolation structure formed near the surface of the semiconductor substrate and interposed between the gate structure and the second well, wherein the isolation structure is laterally separated from the gate structure to expose a portion of a top surface of the third well; and a plurality of field plates electrically coupled to one of the first source/drain region or the gate structure.

19. The semiconductor device of claim 18, further comprising a resist protective oxide layer overlaying at least a portion of the gate structure, the portion of the top surface of the third well, and a portion of the isolation structure.

20. The semiconductor device of claim 18, further comprising a plurality of field plates formed above at least one of a portion of the third well or the isolation structure.

* * * * *